United States Patent
Kimura

(10) Patent No.: US 6,744,141 B2
(45) Date of Patent: Jun. 1, 2004

(54) STACKED CHIP-SIZE PACKAGE TYPE SEMICONDUCTOR DEVICE CAPABLE OF BEING DECREASED IN SIZE

(75) Inventor: Naoto Kimura, Kumamoto (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/190,655

(22) Filed: Jul. 8, 2002

(65) Prior Publication Data

US 2003/0011067 A1 Jan. 16, 2003

(30) Foreign Application Priority Data

Jul. 11, 2001 (JP) ........................................ 2001-210536

(51) Int. Cl.⁷ ........................................... H01L 23/538
(52) U.S. Cl. ..................................................... 257/777
(58) Field of Search ................................ 257/666, 676, 257/723, 737, 738, 777, 778; 438/106–109, 118

(56) References Cited

U.S. PATENT DOCUMENTS

| | | | | |
|---|---|---|---|---|
| 6,337,226 B1 | * | 1/2002 | Symons | 438/109 |
| 6,353,263 B1 | * | 3/2002 | Dotta et al. | 257/777 |
| 6,437,449 B1 | * | 8/2002 | Foster | 257/777 |
| 6,445,594 B1 | * | 9/2002 | Nakagawa et al. | 361/776 |
| 6,448,659 B1 | * | 9/2002 | Lee | 257/777 |
| 6,531,784 B1 | * | 3/2003 | Shim et al. | 257/777 |
| 2001/0035587 A1 | * | 11/2001 | Kondo et al. | 257/777 |
| 2002/0004258 A1 | * | 1/2002 | Nakayama et al. | 438/107 |
| 2003/0038374 A1 | * | 2/2003 | Shim et al. | 257/777 |
| 2003/0057539 A1 | * | 3/2003 | Koopmans | 257/686 |

FOREIGN PATENT DOCUMENTS

JP    2000-307057    11/2000

* cited by examiner

Primary Examiner—Erik J. Kielin
Assistant Examiner—Jennifer M Dolan
(74) Attorney, Agent, or Firm—Katten Muchin Zavis Rosenman

(57) ABSTRACT

In a semiconductor device including a substrate, a first semiconductor chip directly or indirectly on the substrate, and a second semiconductor chip located on the first semiconductor chip, the second semiconductor chip has a larger dimension than that of the first semiconductor chip.

8 Claims, 11 Drawing Sheets

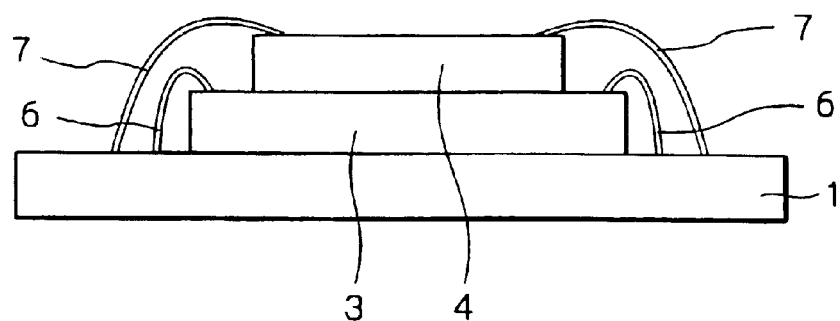
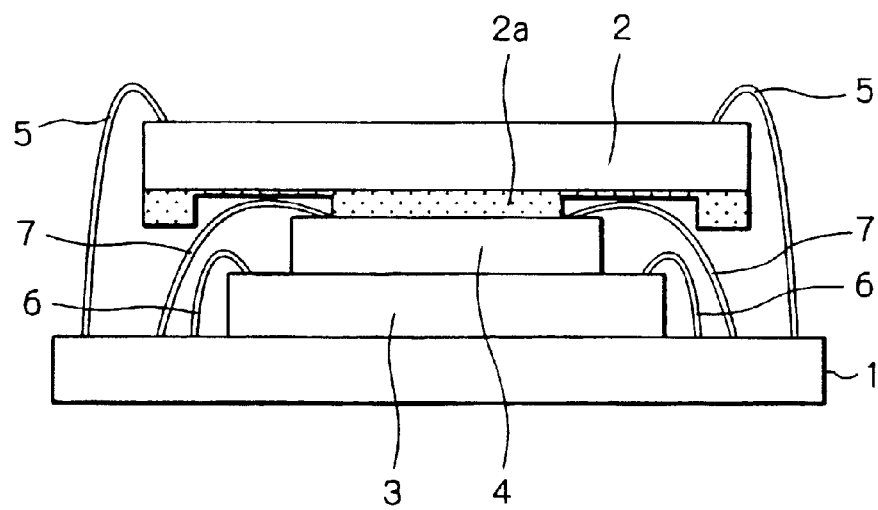

STACKED CHIP-SIZE PACKAGE TYPE SEMICONDUCTOR DEVICE CAPABLE OF BEING DECREASED IN SIZE

BACKGROUND OF THE INVENTION

1. Field of the Invention

The present invention relates to a semiconductor device, and more particularly, to a stacked chip-size package (CSP) type semiconductor device.

2. Description of the Related Art

Recently, semiconductor packages have been developed to adopt stacked chip-size packages (CSPs) having substantially the same size as that of semiconductor chips.

A prior art stacked chip-size package type semiconductor device (see: JP-A-2000-307057) is constructed by a plurality of semiconductor chips stacked on a substrate. In this case, an upper one of the semiconductor chips is smaller than an lower one of the semiconductor chips. This will be explained later in detail.

In the above-described prior art stacked chip-size package type semiconductor device, however, since the largest semiconductor chip is the lowest semiconductor chip, all bonding wires connected between the semiconductor chips and the substrate are outside of the largest semiconductor chip, the substrate is much larger than the largest semiconductor chip, which would increase the stacked chip-size package in size.

SUMMARY OF THE INVENTION

It is an object of the present invention to provide a stacked chip-size package type semiconductor device capable of being decreased in size.

According to the present invention, in a semiconductor device including a substrate, a first semiconductor chip directly or indirectly on the substrate, and a second semiconductor chip located on the first semiconductor chip, the second semiconductor chip has a larger dimension than that of the first semiconductor chip.

If the second semiconductor chip is largest, the largest semiconductor chip is not the lowest semiconductor chip. As a result, some of bonding wires are inside of the largest semiconductor chip, so that the size of the substrate can be brought close to that of the largest semiconductor chip.

BRIEF DESCRIPTION OF THE DRAWINGS

The present invention will be more clearly understood from the description set forth below, as compared with the prior art, with reference to the accompanying drawings, wherein:

FIGS. 9A and 9B are cross-sectional views for explaining a method for manufacturing the stacked chip-size package type semiconductor device of FIG. 8;

DESCRIPTION OF THE PREFERRED EMBODIMENT

Before the description of the preferred embodiments, a prior art stacked chip-size package type semiconductor device will be explained with reference to FIG. 1 (see: JP-A-2000-307057).

Figure 1:
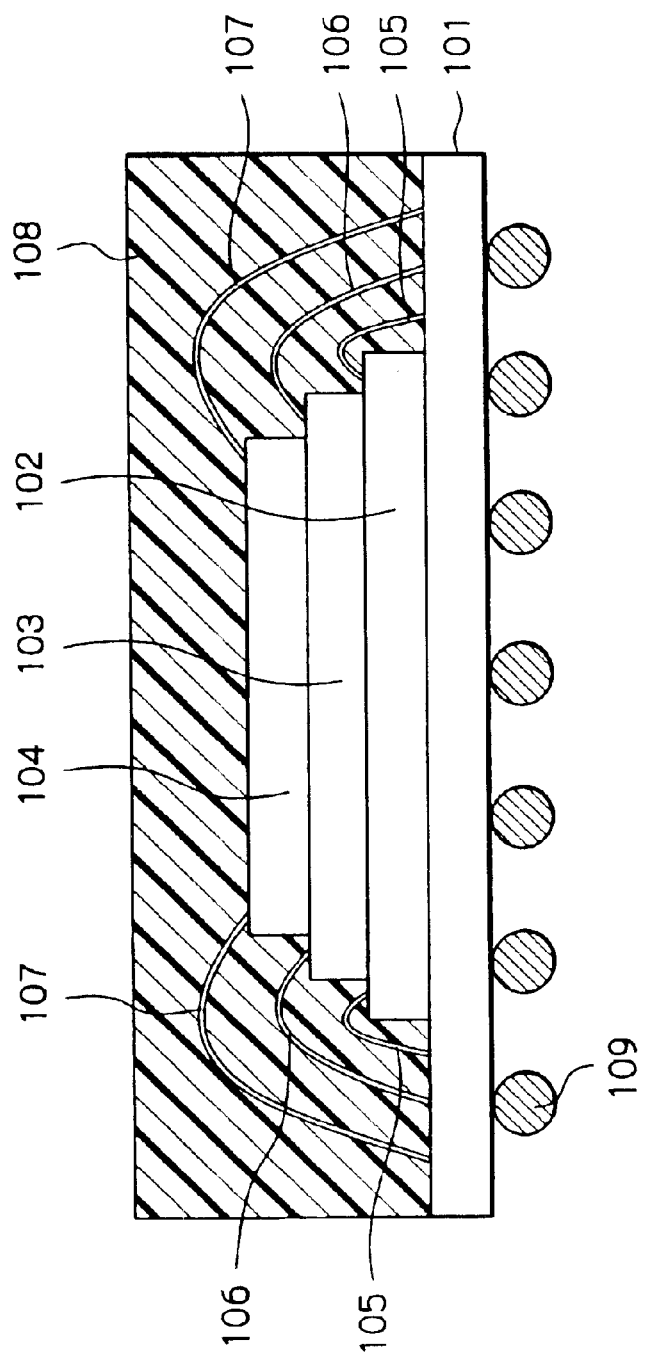
FIG. 1 is a cross-sectional view illustrating a prior art stacked chip-size package type semiconductor device.

In FIG. 1, reference numeral 101 designates a substrate made of glass epoxy or the like. Semiconductor chips 102, 103 and 104 are mounted in this sequence by adhesive sheets (not shown) on a front surface of the substrate 101. Note that, the semiconductor chip 102 is larger than the semiconductor chip 103, and the semiconductor chip 103 is larger than the semiconductor chip 104. Bonding wires 105, 106 and 107 are connected between electrode pads (not shown) of the semiconductor chips 102, 103 and 104 and conductive pads (not shown) of the substrate 101. The semiconductor chips 102, 103 and 104 associated with the bonding wires 105, 106 and 107 are sealed by an epoxy resin layer 108. On the other hand, solder balls 109 are provided on a back surface of the substrate 101, and are connected through internal connections (not shown) within the substrate 101 to the conductive pads thereof.

In the stacked chip-size package type semiconductor device of FIG. 1, however, the bonding wire 105 is outside of the largest semiconductor chip 102, the bonding wire 106 is outside of the bonding wire 105 and the bonding wire 107 is outside of the bonding wire 106, thus preventing the bonding wires 105, 106 and 107 from being short-circuited. That is, all the bonding wires 105, 106 and 107 are outside of the largest semiconductor chip 102, so that the substrate 101 is much larger than the largest semiconductor chip 102, which would increase the stacked chip-size package in size.

Figure 2:
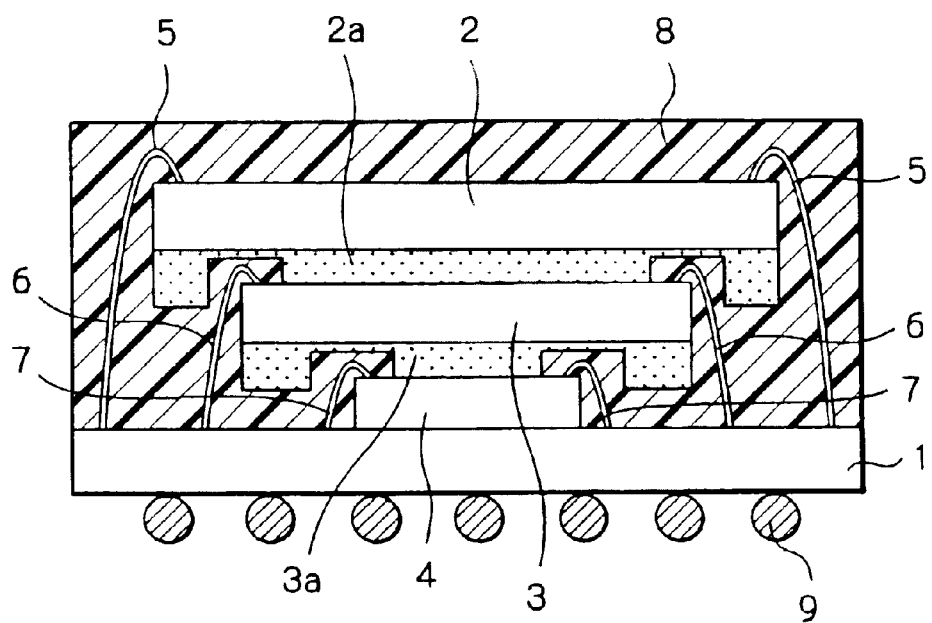
FIG. 2 is a cross-sectional view illustrating a first embodiment of the stacked chip-size package type semiconductor device according to the present invention.

In FIG. 2, which illustrates a first embodiment of the stacked chip-size package type semiconductor device according to the present invention, reference numeral 1 designates a substrate made of glass epoxy or the like. Semiconductor chips 4, 3 and 2 are mounted in this sequence on a front surface of the substrate 1. Note that, the semiconductor chip 2 is larger than the semiconductor chip 3, and the semiconductor chip 3 is larger than the semiconductor chip 4. In this case, the semiconductor chip 4 is adhered by an adhesive sheet (not shown) to the substrate 1. Also, the semiconductor chip 3 is adhered by a thermoplastic adhesive layer 3a to the semiconductor chip 4, and the semiconductor chip 2 is adhered by a thermoplastic adhesive layer 2a to the semiconductor chip 3. Bonding wires 5, 6 and 7 are connected between electrode pads (not shown) of the semiconductor chips 2, 3 and 4 and conductive pads (not shown) of the substrate 1. The semiconductor chips 2, 3 and 4 associated with the bonding wires 5, 6 and 7 are sealed by an epoxy resin layer 8. On the other hand, solder balls 9 are provided on a back surface of the substrate 1, and are connected through internal connections (not shown) within the substrate 1 to the conductive pads thereof.

In the stacked chip-size package type semiconductor device of FIG. 2, since only the bonding wire 5 is outside of the largest semiconductor chip 2, i.e., the bonding wires 6 and 7 hardly affect the size of the substrate 1, the size of the substrate 1 is brought close to that of the largest semiconductor chip 2, which would decrease the stacked chip-size package in size.

The method for manufacturing the stacked chip-size package type semiconductor device of FIG. 2 is explained next with reference to FIGS. 3A, 3B, 3C and 4.

Figure 3A:
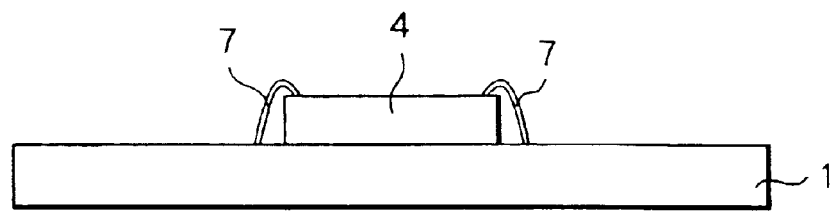
FIGS. 3A, 3B and 3C are cross-sectional views for explaining a method for manufacturing the stacked chip-size package type semiconductor device of FIG. 2.

First, referring to FIG. 3A, a semiconductor chip 4 is mounted by an adhesive sheet (not shown) on a front surface of a substrate 1. Then, bonding wire 7 is connected between electrode pads (not shown) of the semiconductor chip 4 and conductive pads (not shown) of the substrate 1.

Figure 3B:
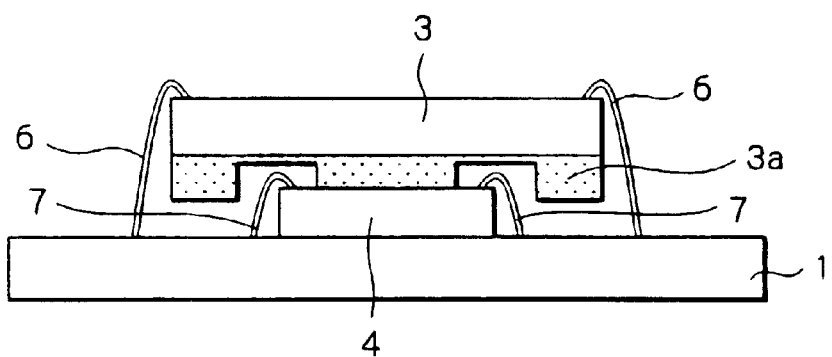
Figure 4:
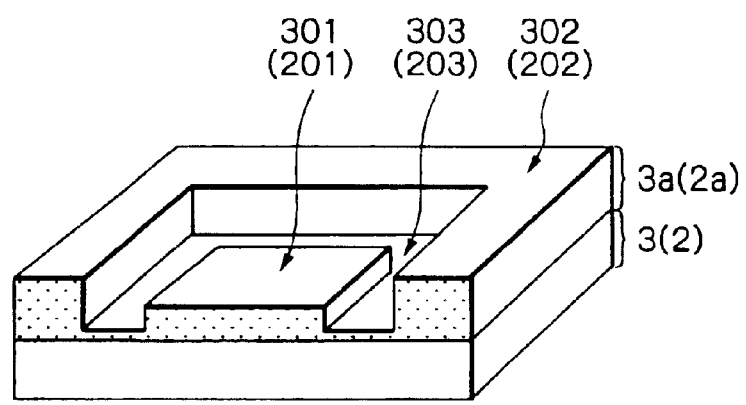
FIG. 4 is a partly-cut perspective view of the thermoplastic adhesive layer of FIGS. 3B and 3C.

Next, referring to FIG. 3B, a semiconductor chip 3 with a back surface coated by a thermoplastic adhesive layer 3a is prepared. In this case, as illustrated in FIG. 4, the thermoplastic adhesive layer 3a is constructed by an about 100 to 200 μm thick centered pedestal portion 301 for being in contact with the semiconductor chip 4, an about 100 to 400 μm thick peripheral reinforcement portion 302 for preventing the semiconductor chip 3 from being deformed by a wire bonding operation and a thin portion 303 between the centered pedestal portion 301 and the peripheral reinforcement portion 302 for encapsulating the bonding wire 7. Then, the semiconductor chip 3 with the thermoplastic adhesive layer 3a is moved down to the semiconductor chip 4, so that the centered pedestal portion 301 of the thermoplastic adhesive layer 3a is in contact with the semiconductor chip 4. Then, a heat operation is performed upon the thermoplastic adhesive layer 3a, so that the semiconductor chip 3 is mounted on the semiconductor chip 4. Then, bonding wire 6 is connected between electrode pads (not shown) of the semiconductor chip 3 and conductive pads (not shown) of the substrate 1.

Figure 3C:
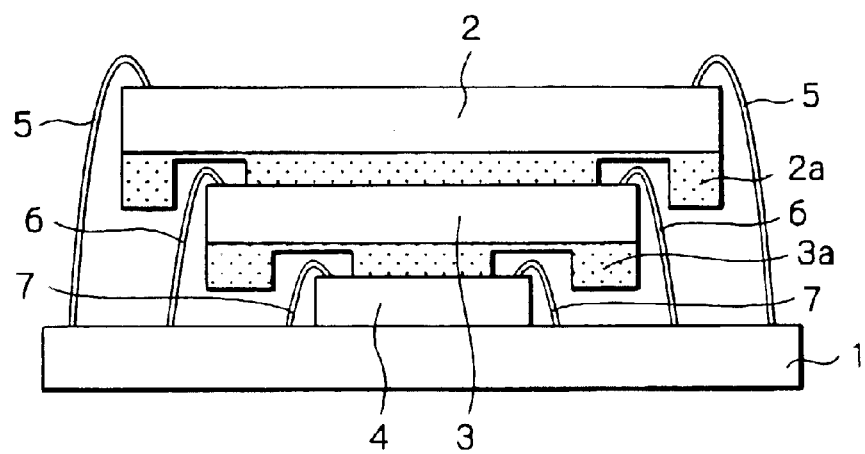

Next, referring to FIG. 3C, a semiconductor chip 2 with a back surface coated by a thermoplastic adhesive layer 2a is prepared. In this case, as illustrated in FIG. 4, the thermoplastic adhesive layer 2a is also constructed by an about 100 to 200 μm thick centered pedestal portion 201 for being in contact with the semiconductor chip 3, an about 100 to 400 μm thick peripheral reinforcement portion 202 for preventing the semiconductor chip 2 from being deformed by a wire bonding operation and a thin portion 203 between the centered pedestal portion 201 and the peripheral reinforcement portion 202 for encapsulating the bonding wire 6. Then, the semiconductor chip 2 with the thermoplastic adhesive layer 2a is moved down to the semiconductor chip 3, so that the centered pedestal portion 201 of the thermoplastic adhesive layer 2a is in contact with the semiconductor chip 3. Then, a heat operation is performed upon the thermoplastic adhesive layer 2a, so that the semiconductor chip 2 is mounted on the semiconductor chip 3. Then, bonding wire 5 is connected between electrode pads (not shown) of the semiconductor chip 2 and conductive pads (not shown) of the substrate 1.

Finally, the semiconductor chips 2, 3 and 4 associated with the bonding wires 5, 6 and 7 are sealed by an epoxy resin layer 8 (see: FIG. 2), and solder balls 9 (see FIG. 2) are provided on a back surface of the substrate 1, to thereby complete the stacked chip-size package type semiconductor device of FIG. 2.

Figure 5:
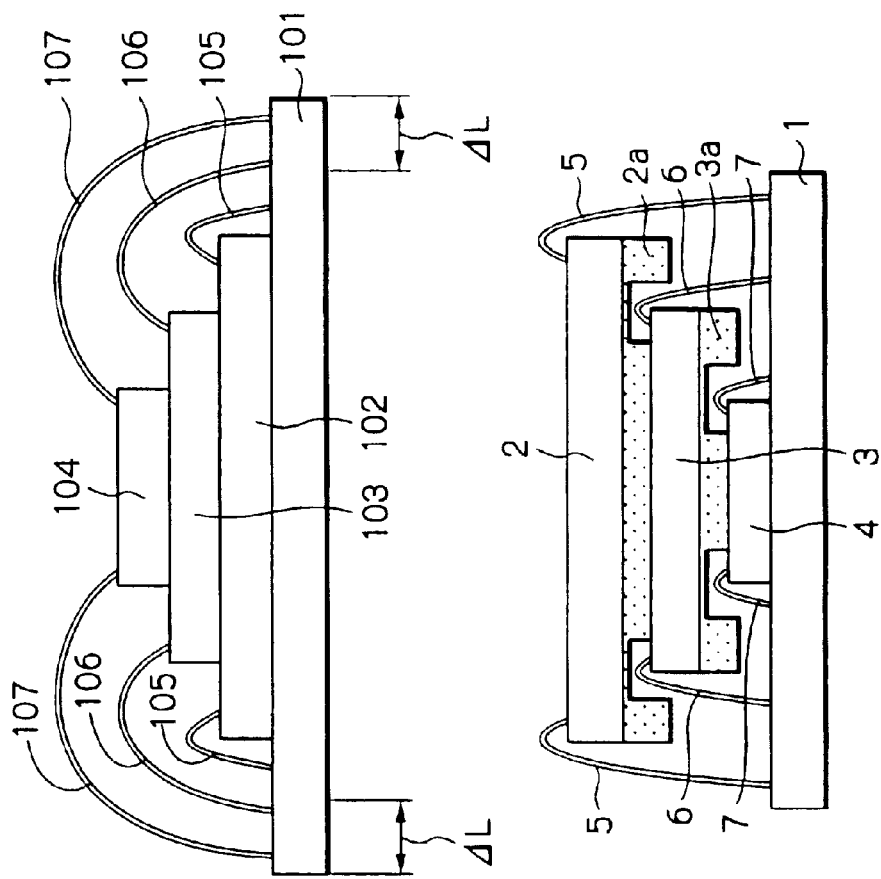
FIGS. 5A and 5B are cross-sectional views for explaining the effect of the first embodiment of the present invention as compared with the prior art.

In the stacked chip-size package type semiconductor device of FIG. 1, the bonding wires 105, 106 and 107 are outside of the largest semiconductor chip 102 (see: FIG. 5A). On the other hand, in the stacked chip-size package type semiconductor device of FIG. 2, the bonding wire 5 is outside of the largest semiconductor chip 5 while the bonding wires 6 and 7 are inside of the largest semiconductor chip 5 (see: FIG. 5B). Thus, the length of the substrate 1 can be shortened by 2·ΔL as compared with the substrate 101, which would decrease the stacked chip-size package type semiconductor device of FIG. 2 in size. Additionally, the total length of bonding wire made of Au can be decreased, which would decrease the manufacturing cost.

Further, since the peripheral reinforcement portion 303 (203) of the thermoplastic adhesive layer 2a(3a) has a high rigidity, even when a load is applied by a wire operation to the semiconductor chip 3 or 2, the semiconductor chip 3 or 2 is hardly deformed.

Figure 6:
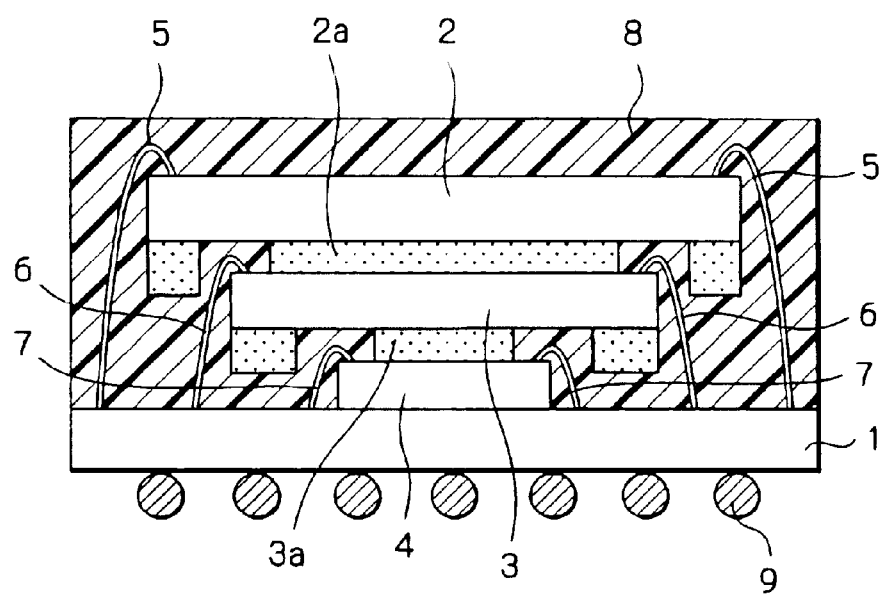
FIG. 6 is a cross-sectional view illustrating a modification of the stacked chip-size package type semiconductor device of FIG. 2.
Figure 7:
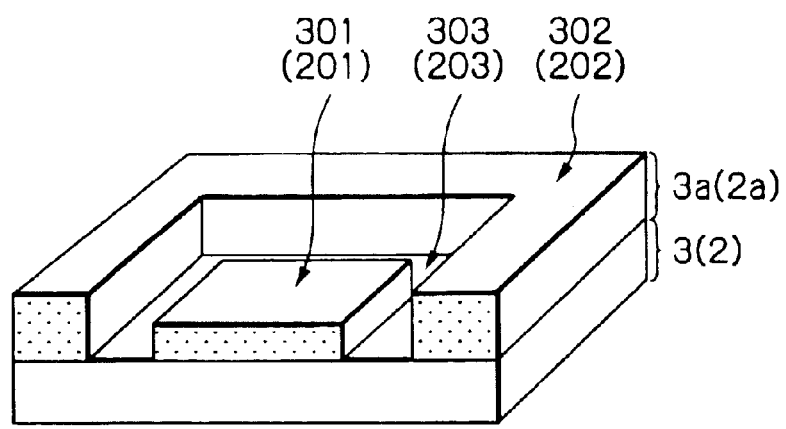
FIG. 7 is a partly-cut, perspective view illustrating a modification of the thermoplastic adhesive layer of FIG. 4.

Although the thin portion 303(203) is provided in the thermoplastic adhesive layer 3a(2a), the thin portion 303 (203) can be removed as illustrated in FIGS. 6 and 7 which are modifications of FIGS. 2 and 4, respectively.

Figure 8:
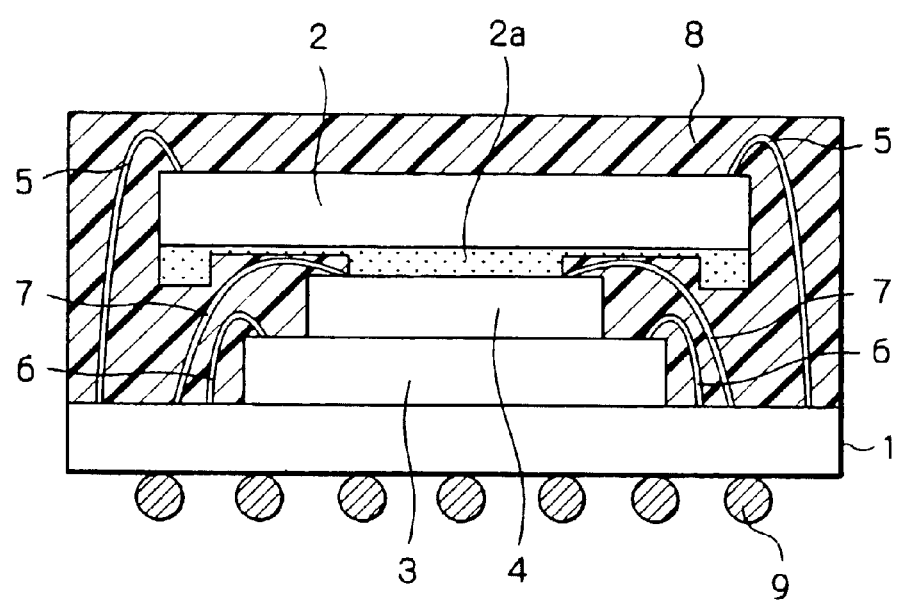
FIG. 8 is a cross-sectional view illustrating a second embodiment of the stacked chip-size package type semiconductor device according to the present invention.

In FIG. 8, which illustrates a second embodiment of the stacked chip-size package type semiconductor device according to the present invention, the semiconductor chips 3, 4 and 2 are mounted in this sequence on a front surface of the substrate 1. In this case, the semiconductor chip 3 is adhered by an adhesive sheet (not shown) to the substrate 1. Also, the semiconductor chip 4 is adhered by an adhesive sheet (not shown) to the semiconductor chip 3, and the semiconductor chip 2 is adhered by a thermoplastic adhesive layer 2a to the semiconductor chip 4.

Even in the stacked chip-size package type semiconductor device of FIG. 8, since only the bonding wire 5 is outside of the largest semiconductor chip 2, i.e., the bonding wires 6 and 7 hardly affect the size of the substrate 1, the size of the substrate 1 is brought close to that of the largest semiconductor chip 2, which would decrease the stacked chip-size package in size.

The method for manufacturing the stacked chip-size package type semiconductor device of FIG. 8 is explained next with reference to FIGS. 9A and 9B.

First, referring to FIG. 9A, semiconductor chips 3 and 4 are mounted by adhesive sheets (not shown) on a front surface of a substrate 1. Then, bonding wires 6 and 7 are connected between electrode pads (not shown) of the semiconductor chips 3 and 4 and conductive pads (not shown) of the substrate 1.

Next, referring to FIG. 9B, a semiconductor chip 2 with a back surface coated by a thermoplastic adhesive layer 2a as illustrated in FIG. 4 is prepared. Then, the semiconductor chip 2 with the thermoplastic adhesive layer 2a is moved down to the semiconductor chip 4, so that the centered pedestal portion 201 of the thermoplastic adhesive layer 2a is in contact with the semiconductor chip 4. Then, a heat operation is performed upon the thermoplastic adhesive layer 2a, so that the semiconductor chip 2 is mounted on the semiconductor chip 4. Then, bonding wire 5 is connected between electrode pads (not shown) of the semiconductor chip 2 and conductive pads (not shown) of the substrate 1.

Finally, the semiconductor chips 2, 3 and 4 associated with the bonding wires 5, 6 and 7 are sealed by an epoxy resin layer 8 (see: FIG. 8), and solder balls 9 (see FIG. 8) are provided on a back surface of the substrate 1, to thereby complete the stacked chip-size package type semiconductor device of FIG. 8.

Even in the above-described second embodiment, although the thin portion 203 is provided in the thermoplastic adhesive layer 2a, the thin portion 203 can be removed.

Figure 10:
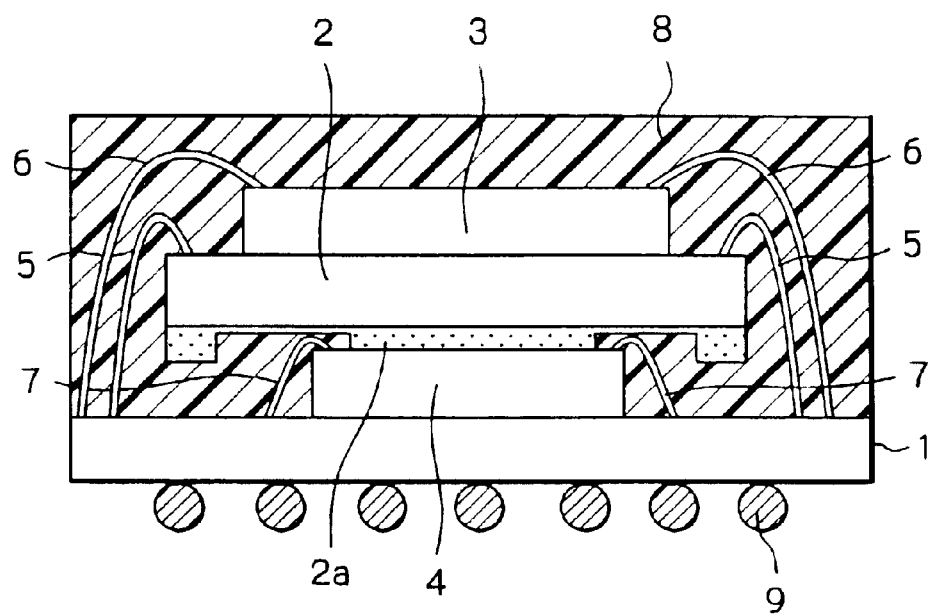
FIG. 10 is a cross-sectional view illustrating a third embodiment of the stacked chip-size package type semiconductor device according to the present invention.

In FIG. 10, which illustrates a third embodiment of the stacked chip-size package type semiconductor device according to the present invention, the semiconductor chips 4, 2 and 3 are mounted in this sequence on a front surface of the substrate 1. In this case, the semiconductor chip 4 is adhered by an adhesive sheet (not shown) to the substrate 1. Also, the semiconductor chip 2 is adhered by a thermoplastic adhesive layer 2a to the semiconductor chip 4, and the semiconductor chip 3 is adhered by an adhesive sheet (not shown) to the semiconductor chip 2.

In the stacked chip-size package type semiconductor device of FIG. 10, since the bonding wires 5 and 6 are outside of the largest semiconductor chip 2, i.e., the bonding wire 7 hardly affects the size of the substrate 1, the size of the substrate 1 is brought close to that of the largest semiconductor chip 2, which would decrease the stacked chip-size package in size.

The method for manufacturing the stacked chip-size package type semiconductor device of FIG. 10 is explained next with reference to FIGS. 11A and 11B.

Figure 11A:
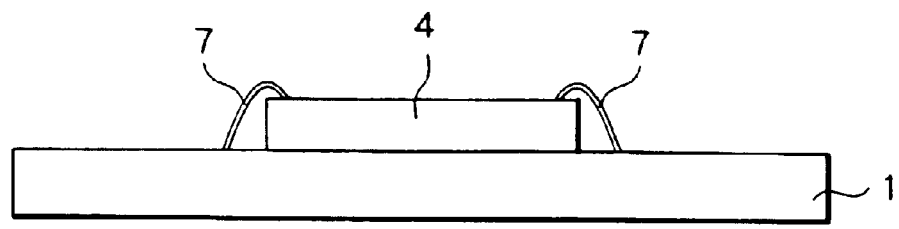
FIGS. 11A and 11B are cross-sectional views for explaining a method for manufacturing the stacked chip-size package type semiconductor device of FIG. 10.

First, referring to FIG. 11A, a semiconductor chip 4 is mounted by an adhesive sheet (not shown) on a front surface of a substrate 1. Then, bonding wire 7 is connected between electrode pads (not shown) of the semiconductor chip 4 and conductive pads (not shown) of the substrate 1.

Figure 11B:
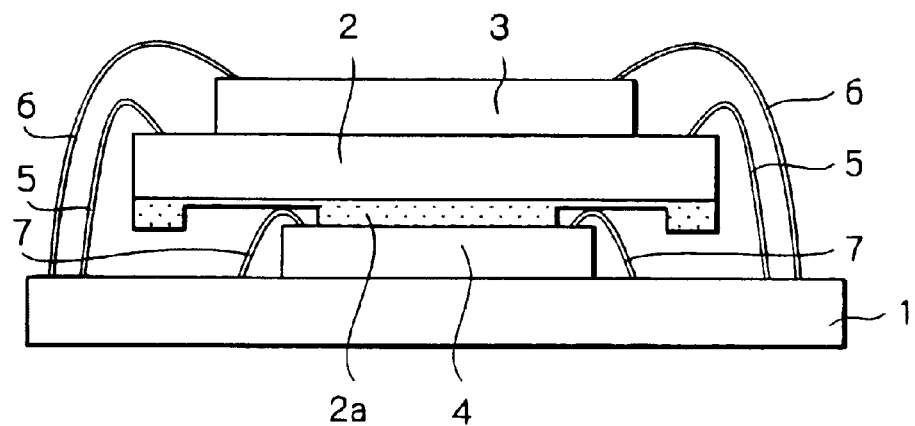

Next, referring to FIG. 11B, a semiconductor chip 2 with a back surface coated by a thermoplastic adhesive layer 2a as illustrated in FIG. 4 is prepared. Then, the semiconductor chip 2 with the thermoplastic adhesive layer 2a is moved down to the semiconductor chip 4, so that the centered pedestal portion 201 of the thermoplastic adhesive layer 2a is in contact with the semiconductor chip 4. Then, a heat operation is performed upon the thermoplastic adhesive layer 2a, so that the semiconductor chip 2 is mounted on the semiconductor chip 4. Then, a semiconductor chip 3 is adhered by an adhesive sheet (not shown) to the semiconductor chip 2. Then, bonding wires 5 and 6 are connected between electrode pads (not shown) of the semiconductor chips 2 and 3 and conductive pads (not shown) of the substrate 1.

Finally, the semiconductor chips 2, 3 and 4 associated with the bonding wires 5, 6 and 7 are sealed by an epoxy resin layer 8 (see: FIG. 10), and solder balls 9 (see FIG. 10) are provided on a back surface of the substrate 1, to thereby complete the stacked chip-size package type semiconductor device of FIG. 10.

In the above-described third embodiment, although the thin portion 203 is provided in the thermoplastic adhesive layer 2a, the thin portion 203 can be removed.

In the above-described embodiments, three semiconductor chips are stacked on a substrate, however, the present invention can be applied to a stacked chip-size package where two, four or more semiconductor chips are stacked.

As explained hereinabove, according to the present invention, since the largest semiconductor chip is not the lowest semiconductor chip, the total number of bonding wires outside of the largest semiconductor chip is decreased, so that the size of a substrate can be brought close to that the largest semiconductor chip, thus decreasing the stacked chip-size package in size.

What is claimed is:
1. A semiconductor device comprising:
a substrate;
a first semiconductor chip directly or indirectly on said substrate;
a second semiconductor chip located on said first semiconductor chip, said second semiconductor chip having a larger dimension than that of said first semiconductor chip;
bonding wire connected between said first semiconductor chip and said substrate, wherein said bonding wire is located within a perimeter of said second semiconductor chip; and
an adhesive layer between said first and second semiconductor chips, said adhesive layer having a thin portion encapsulating said bonding wire.

2. A semiconductor device comprising:
a substrate;
a first semiconductor chip directly or indirectly on said substrate;
a second semiconductor chip located on said first semiconductor chip, said second semiconductor chip having a larger dimension than that of said first semiconductor chip;
bonding wire connected between said first semiconductor chip and said substrate, wherein said bonding wire is located within a perimeter of said second semiconductor chip; and
an adhesive layer between said first and second semiconductor chips, said adhesive layer having a recess portion encapsulating said bonding wire.

3. A semiconductor device comprising:
a substrate;
a plurality of semiconductor chips stacked on said substrate,
an upper one of said semiconductor chips being larger than a lower one of said semiconductor chips immediately lower than said upper one of said semiconductor chips;
bonding wire connected between said lower one of said semiconductor chips and said substrate, wherein said bonding wire is located within a perimeter of said upper one of said semiconductor chips; and
an adhesive layer provided on a back surface of said upper one of said semiconductor chips, said adhesive layer having a thin portion encapsulating said bonding wire.

4. A semiconductor device comprising:
a substrate;
a plurality of semiconductor chips stacked on said substrate,
an upper one of said semiconductor chips being larger than a lower one of said semiconductor chips immediately lower than said upper one of said semiconductor chips;
bonding wire connected between said lower one of said semiconductor chips and said substrate, wherein said bonding wire is located within a perimeter of said upper one of said semiconductor chips; and
an adhesive layer provided on a back surface of said upper one of said semiconductor chips, said adhesive layer having a recess portion encapsulating said bonding wire.

5. A semiconductor device comprising:
a substrate;
a plurality of semiconductor chips stacked on said substrate, one of said semiconductor chips having the largest dimension being not the lowest one of said semiconductor chips;

bonding wire connected between another of said semiconductor chips immediately lower than said one of said semiconductor chips and said substrate, wherein said bonding wire is located within a perimeter of said one of said semiconductor chips; and an adhesive layer provided on a back surface of said one of said semiconductor chips, said adhesive layer having a thin portion encapsulating said bonding wire.

6. A semiconductor device comprising:

a substrate;

a plurality of semiconductor chips stacked on said substrate, one of said semiconductor chips having the largest dimension being not the lowest one of said semiconductor chips;

bonding wire connected between another of said semiconductor chips immediately lower than said one of said semiconductor chips and said substrate, wherein said bonding wire is located within a perimeter of said one of said semiconductor chips; and an adhesive layer provided on a back surface of said one of said semiconductor chips, said adhesive layer having a recess portion encapsulating said bonding wire.

7. A semiconductor device comprising:

a substrate;

n (n=2, 3, . . . ) semiconductor chips stacked on said substrate, wherein an i-th (i=2, . . . , n) one of said semiconductor chips is larger than an (i−1)-th one of said semiconductor chips immediately lower than said i-th semiconductor chip;

bonding wire connected between said (i−1)-th semiconductor chip and said substrate, wherein said bonding wire is located within a perimeter of said i-th semiconductor chip; and one adhesive layer between said i-th semiconductor chip and said (i−1)-th semiconductor chip, said adhesive layer having a thin portion encapsulating said bonding wire.

8. A semiconductor device comprising:

a substrate;

n (n=2, 3, . . . ) semiconductor chips stacked on said substrate, wherein an i-th (i=2, . . . , n) one of said semiconductor chips is larger than an (i−1)-th one of said semiconductor chips immediately lower than said i-th semiconductor chip;

bonding wire connected between said (i−1)-th semiconductor chip and said substrate, wherein said bonding wire is located within a perimeter of said i-th semiconductor chip; and one adhesive layer between said i-th semiconductor chip and said (i−1)-th semiconductor chip, said adhesive layer having a recess portion encapsulating said bonding wire.

* * * * *